US011937027B2

(12) United States Patent
Ojha et al.

(10) Patent No.: US 11,937,027 B2
(45) Date of Patent: Mar. 19, 2024

(54) BALLASTED TELECOMMUNICATIONS EQUIPMENT MOUNTS AND ASSEMBLIES

(71) Applicant: CommScope Technologies LLC, Hickory, NC (US)

(72) Inventors: Jyoti Ojha, Southlake, TX (US); Dale Heath, Fort Worth, TX (US); Michael Carnes, Euless, TX (US); Kevin Ray Paswalk, Watauga, TX (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 17/930,557

(22) Filed: Sep. 8, 2022

(65) Prior Publication Data
US 2023/0007369 A1    Jan. 5, 2023

Related U.S. Application Data

(63) Continuation of application No. 17/027,837, filed on Sep. 22, 2020, now Pat. No. 11,483,632.
(Continued)

(51) Int. Cl.
*H01Q 1/12* (2006.01)
*H01Q 1/18* (2006.01)
(Continued)

(52) U.S. Cl.
CPC ............. *H04Q 1/09* (2013.01); *H01Q 1/1214* (2013.01); *H01Q 1/18* (2013.01); *H01Q 1/20* (2013.01); *H04Q 1/02* (2013.01); *H05K 7/186* (2013.01)

(58) Field of Classification Search
CPC ...... H01Q 1/1214; H01Q 1/1221; H01Q 1/18; H01Q 1/20; H01Q 1/246; H04Q 1/09; H04Q 1/02; H05K 7/186
See application file for complete search history.

(56) References Cited

U.S. PATENT DOCUMENTS 2,597,733 A * 5/1952 Foster .................. H01Q 1/1221
                                                248/539
3,940,771 A * 2/1976 Wild ..................... H01Q 1/125
                                                343/882
(Continued)

FOREIGN PATENT DOCUMENTS

CN    203867263 U   10/2014
CN    105960733 A    9/2016
(Continued)

OTHER PUBLICATIONS

"Extended European Search Report corresponding to European Patent Application No. 20198428.3, dated Feb. 25, 2021".

*Primary Examiner* — Ab Salam Alkassim, Jr.
(74) *Attorney, Agent, or Firm* — Myers Bigel, P.A.

(57) ABSTRACT

The present disclosure describes a telecommunications equipment mount. The mount includes a stabilization frame having a bottom and at least three sides, the bottom and sides defining an open interior cavity, at least one mounting member perpendicular to one of the sides of the stabilization frame and extending outwardly from the side of the stabilization frame a distance, and at least one brace member. The at least one brace member includes a first bracket coupled to one side of the stabilization frame and configured to be secured to the at least one mounting member and a second bracket extending outwardly from the same side of the stabilization frame at an angle. A first end of the second bracket is coupled to a lower end of the first bracket and a second opposing end of the second bracket is configured to be secured to the at least one mounting member at a different location than the first bracket. The stabilization frame is configured to ballast the mount on a mounting structure (Continued)

when telecommunications equipment is secured to the mount. Telecommunications equipment mount assemblies are also described herein.

20 Claims, 11 Drawing Sheets

Related U.S. Application Data

(60) Provisional application No. 62/976,423, filed on Feb. 14, 2020, provisional application No. 62/907,117, filed on Sep. 27, 2019.

(51) Int. Cl.
*H01Q 1/20* (2006.01)
*H04Q 1/02* (2006.01)
*H05K 7/18* (2006.01)

(56) References Cited

U.S. PATENT DOCUMENTS

| | | | |
|---|---|---|---|
| 4,181,284 A | 1/1980 | Seppelfrick | |
| 4,745,412 A | 5/1988 | Creaser | |
| 4,922,264 A | 5/1990 | Fitzgerald et al. | |
| 5,787,673 A * | 8/1998 | Noble | E04H 12/085 52/114 |
| 5,835,068 A | 11/1998 | Paul et al. | |
| 5,954,305 A * | 9/1999 | Calabro | H01Q 1/1242 343/890 |
| 5,971,345 A * | 10/1999 | Khalaf | H01Q 1/1228 343/890 |
| 5,979,844 A * | 11/1999 | Hopkins | E01F 9/692 248/910 |
| 6,028,566 A | 2/2000 | Pennell et al. | |
| 6,115,004 A * | 9/2000 | McGinnis | H01Q 1/1242 343/890 |
| 6,229,497 B1 * | 5/2001 | McCracken | E04G 21/3238 343/890 |
| 6,237,888 B1 * | 5/2001 | Coll | H01Q 1/1207 248/539 |
| 7,113,145 B1 * | 9/2006 | Noble | H01Q 1/1228 343/890 |
| 9,118,106 B2 * | 8/2015 | Adams | H01Q 1/12 |
| 9,812,762 B2 * | 11/2017 | Skrepcinski | F16M 11/126 |
| 10,826,155 B2 * | 11/2020 | Roy | H01Q 1/12 |
| 11,483,632 B2 * | 10/2022 | Ojha | H01Q 1/1221 |
| 2003/0016183 A1 * | 1/2003 | Pyanowski | H01Q 1/44 343/878 |
| 2003/0071179 A1 * | 4/2003 | Mearns | E04G 21/3238 248/163.1 |
| 2003/0160731 A1 | 8/2003 | Wensink | |
| 2006/0087476 A1 * | 4/2006 | Piburn | H01Q 1/246 343/890 |
| 2008/0278402 A1 | 11/2008 | Kreitzberg et al. | |
| 2013/0214652 A1 | 8/2013 | Mathewson | |
| 2014/0203150 A1 * | 7/2014 | Stenzel | E04H 12/24 248/70 |
| 2015/0159337 A1 * | 6/2015 | Kellner | E02D 5/80 248/156 |
| 2015/0323124 A1 * | 11/2015 | Erdos | F16M 11/38 211/13.1 |
| 2016/0211569 A1 * | 7/2016 | Skrepcinski | H01Q 1/1228 |
| 2016/0302078 A1 | 10/2016 | Sivanandar et al. | |
| 2017/0248766 A1 * | 8/2017 | Coburn | H02G 3/0608 |
| 2018/0026327 A1 | 1/2018 | Hendrix et al. | |
| 2019/0036209 A1 * | 1/2019 | Au | H01Q 1/44 |
| 2019/0267696 A1 * | 8/2019 | Stekr | H01Q 1/1207 |
| 2019/0348742 A1 * | 11/2019 | Palmer | H01Q 1/1228 |
| 2019/0356035 A1 | 11/2019 | Dominguez | |
| 2020/0123790 A1 * | 4/2020 | de la Soujeole | E04G 5/08 |
| 2020/0411945 A1 * | 12/2020 | Heath | E04B 7/18 |
| 2021/0005950 A1 * | 1/2021 | Ojha | H01Q 1/1228 |
| 2021/0075084 A1 | 3/2021 | Moore et al. | |
| 2021/0098857 A1 * | 4/2021 | Ojha | H05K 7/186 |
| 2021/0265725 A1 | 8/2021 | Clifford et al. | |
| 2021/0367320 A1 * | 11/2021 | Wang | H01Q 1/1264 |
| 2022/0311121 A1 * | 9/2022 | Cross | H01Q 1/1207 |

FOREIGN PATENT DOCUMENTS

| | | |
|---|---|---|
| CN | 107706530 A | 2/2018 |
| CN | 110416684 A | 11/2019 |
| CN | 112584560 A | 3/2021 |

* cited by examiner

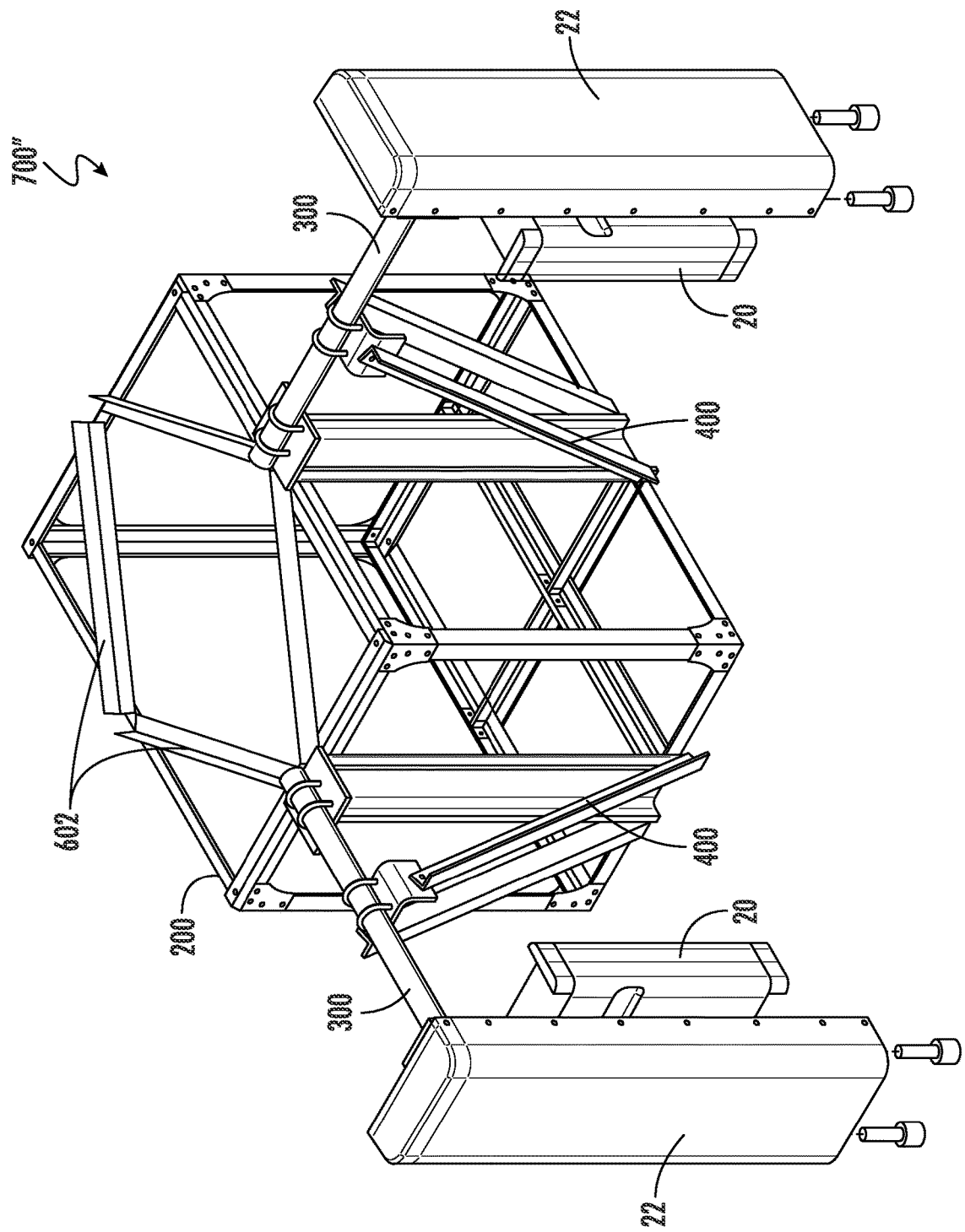

BALLASTED TELECOMMUNICATIONS EQUIPMENT MOUNTS AND ASSEMBLIES

RELATED APPLICATIONS

The present application is a continuation of U.S. application Ser. No. 17/027,837 filed Sep. 22, 2020, which claims priority from and the benefit of U.S. Provisional Application Ser. No. 62/907,117, filed Sep. 27, 2019, and U.S. Provisional Application Ser. No. 62/976,423, filed Feb. 14, 2020, the disclosures of which are hereby incorporated herein in their entireties.

FIELD

The present application is directed generally toward telecommunications equipment, and more particularly, telecommunications equipment mounts suitable for use on, for example, parapet walls.

BACKGROUND

A parapet is a barrier which is an extension of a wall at the edge of a roof, terrace, balcony, walkway or other structure. Telecommunications equipment mounts 10 installed on parapet walls 12 are known (see, e.g., FIG. 1). However, since parapet walls 12 typically are not structural load bearing walls, they typically do not have sufficient capacity to support multiple pieces of telecommunications equipment 14, such as, antennas and remote radio units. Therefore, technicians installing telecommunications equipment 14 on a parapet wall 10 must secure the equipment 14 to both the parapet wall 12 and the roof (or other structure) which can result in damage to both structures. There may be a need for telecommunications equipment mounts that are suitable for use on parapet walls without the risk of damage, while also reducing costs and allowing for easy installation.

SUMMARY

A first aspect of the present invention is directed to a telecommunications equipment mount. The mount includes a stabilization frame having a bottom and at least three sides, the bottom and sides defining an open interior cavity, at least one mounting member perpendicular to one of the sides of the stabilization frame and extending outwardly from the side of the stabilization frame a distance, and at least one brace member. The at least one brace member includes a first bracket coupled to one side of the stabilization frame and configured to be secured to the at least one mounting member and a second bracket extending outwardly from the same side of the stabilization frame at an angle. A first end of the second bracket is coupled to a lower end of the first bracket and a second opposing end of the second bracket is configured to be secured to the at least one mounting member at a different location than the first bracket. The stabilization frame is configured to ballast the mount on a mounting structure when telecommunications equipment is secured to the mount.

Another aspect of the present invention is directed to a telecommunications equipment mount. The mount includes a stabilization frame having a plurality of lower rails, a plurality of vertical rails, and a plurality of upper rails, the lower, vertical, and upper rails forming a top, a bottom, and sides of the stabilization frame to define an open interior cavity, and one or more mounting pipes, each mounting pipe secured to a respective side of the stabilization frame.

Another aspect of the present invention is directed to a telecommunications equipment mount assembly. The assembly includes one or more units of telecommunications equipment, a mounting structure including a parapet wall, and a telecommunications equipment mount. The mount includes a stabilization frame having a bottom and at least three sides, the bottom and sides defining an open interior cavity, at least one mounting member extending outwardly from, and perpendicular to, one of the sides of the stabilization frame a distance, at least one brace member, and at least one mounting pipe secured to the at least one mounting member. The at least one the at least one brace member includes a first bracket coupled to one side of the stabilization frame and configured to be secured to the at least one mounting member and a second bracket extending outwardly from the same side of the stabilization frame at an angle. A first end of the second bracket is coupled to a lower end of the first bracket and a second opposing end of the second bracket is configured to be secured to the at least one mounting member at a different location than the first bracket. The one or more units of telecommunications equipment is secured to the at least one mounting pipe, and the telecommunications equipment mount and telecommunications equipment are ballasted on the parapet wall.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim and/or file any new claim, accordingly, including the right to be able to amend any originally filed claim to depend from and/or incorporate any feature of any other claim or claims although not originally claimed in that manner. These and other objects and/or aspects of the present invention are explained in detail in the specification set forth below. Further features, advantages and details of the present invention will be appreciated by those of ordinary skill in the art from a reading of the figures and the detailed description of the preferred embodiments that follow, such description being merely illustrative of the present invention.

BRIEF DESCRIPTION OF THE FIGURES

FIG. 4C is a perspective view of a telecommunications equipment mount with remote radio units and antennas mounted thereon according to embodiments of the present invention.

DETAILED DESCRIPTION

Figure 1:
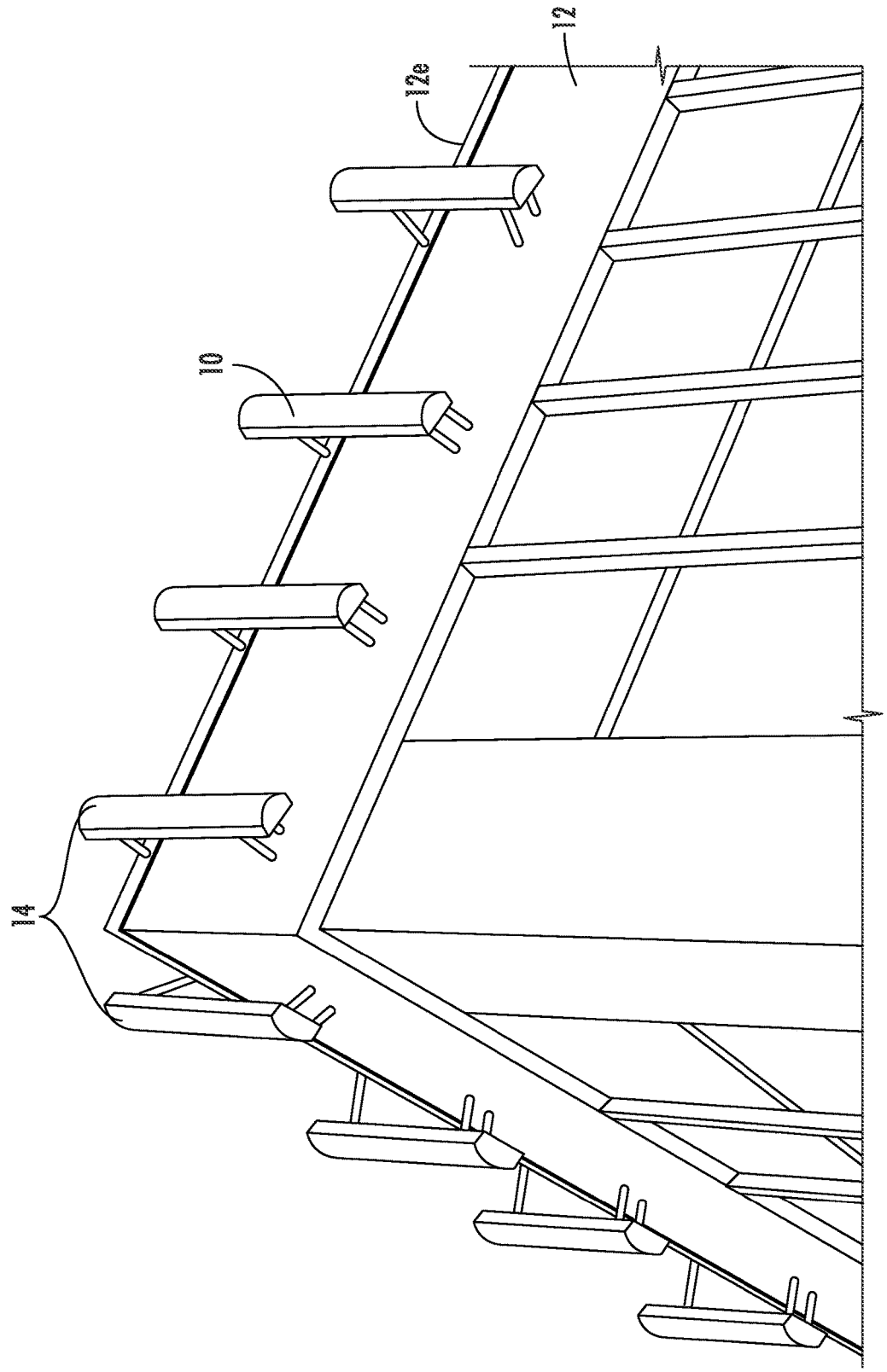
FIG. 1 is a photograph of prior art telecommunications equipment mounts used on parapet walls.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The present invention now will be described more fully hereinafter with reference to the accompanying drawings, in which illustrative embodiments of the invention are shown. Like numbers refer to like elements throughout and different embodiments of like elements can be designated using a different number of superscript indicator apostrophes (e.g., 10', 10", 10'").

In the figures, certain layers, components or features may be exaggerated for clarity, and broken lines illustrate optional features or operations unless specified otherwise. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. The sequence of operations (or steps) is not limited to the order presented in the claims or figures unless specifically indicated otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Pursuant to embodiments of the present invention, telecommunications equipment mounts are provided that may be ballasted and non-penetrating for use on, for example, rooftop parapet walls. Telecommunications equipment mount assemblies are also provided herein. Embodiments of the present invention will now be discussed in greater detail with reference to FIGS. 2A-8.

Figure 2A:
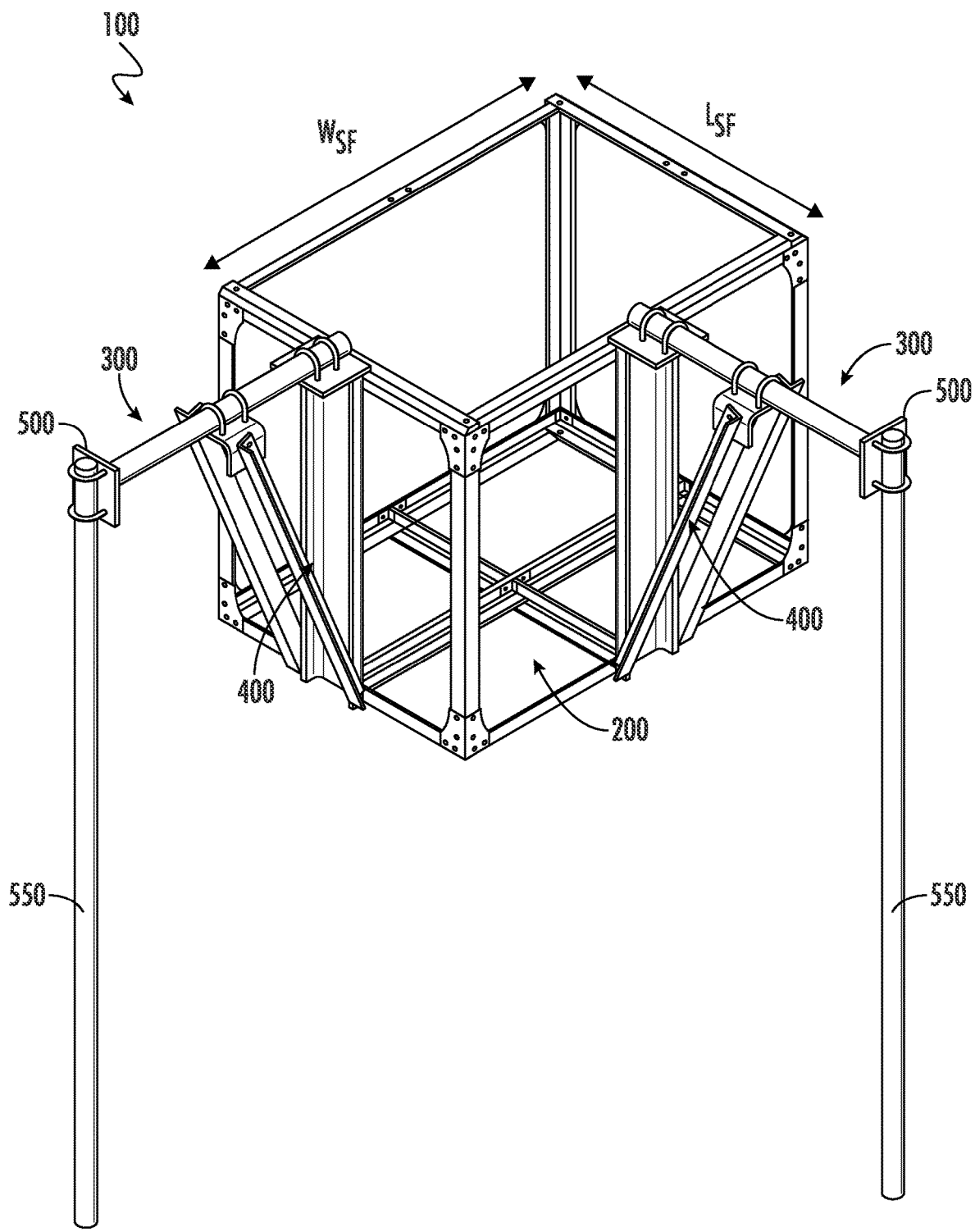
FIG. 2A is a perspective view of a telecommunications equipment mount according to embodiments of the present invention.
Figure 2B:
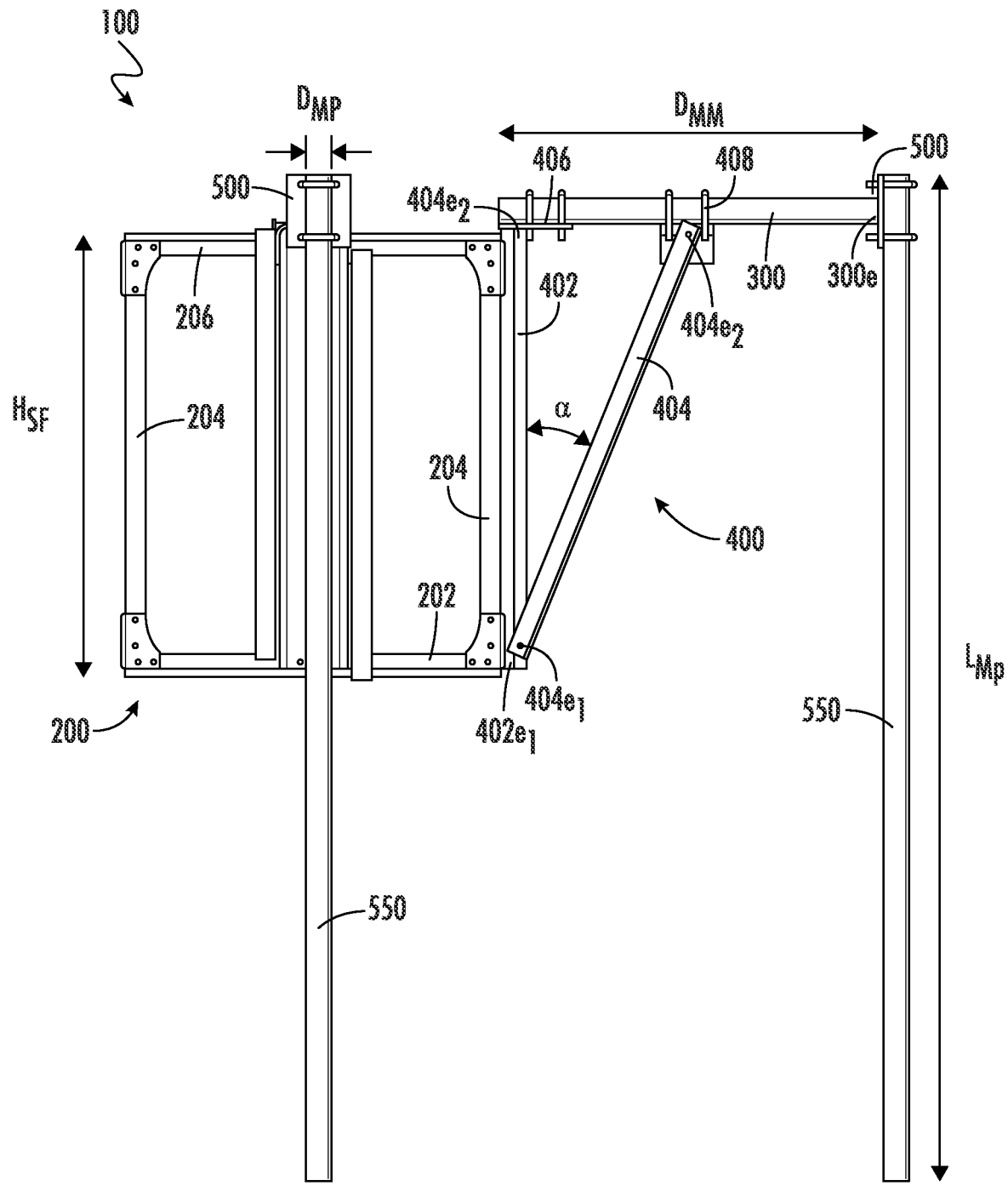
FIG. 2B is a side view of the telecommunications equipment mount of FIG. 2A.
Figure 2C:
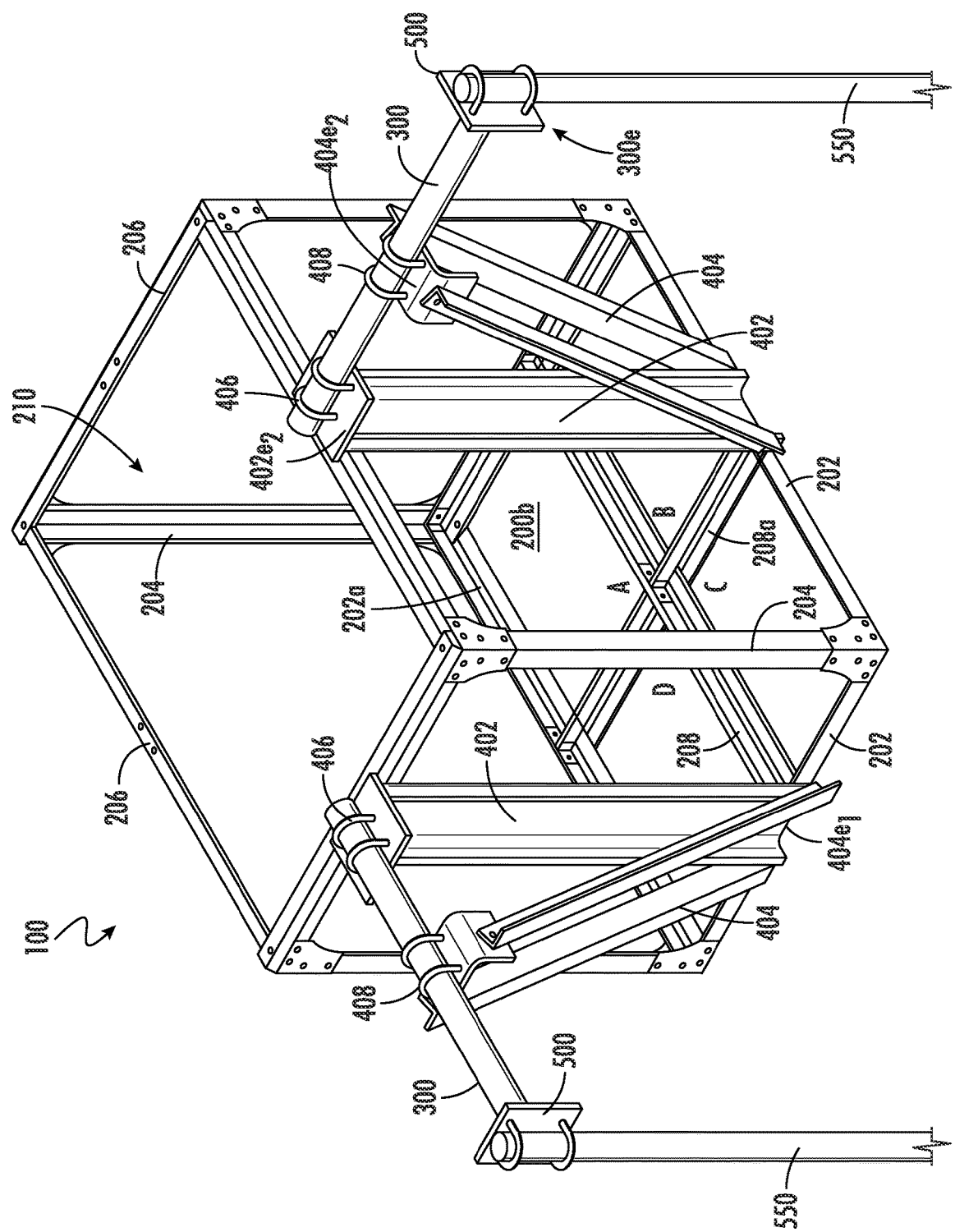
FIG. 2C is an enlarged partial view of the telecommunications equipment mount of FIG. 2A.

Referring to FIGS. 2A-2C, a telecommunications equipment mount 100 according to embodiments of the present invention is illustrated. As shown in FIG. 2A and FIG. 2B, the telecommunications equipment mount 100 comprises a stabilization frame 200, at least one mounting member 300, and at least one brace member 400. Each of these components of the telecommunications equipment mount 100 will be discussed in further detail below.

The stabilization frame 200 comprises a plurality of lower rails 202, a plurality of vertical rails 204, and a plurality of upper rails 206. The lower rails 202, vertical rails 204, and upper rails 206 are coupled together to define a closed structure having a top 200t, a bottom 200b, and at least three sides 200s (see, e.g., FIG. 7) with an open interior cavity 210. As shown in FIGS. 2A-6, in some embodiments, the rails 202, 204, 206 of the stabilization frame 200 define a structure 200 having a rectangular prism (or cuboid) shape with a length $L_{SF}$, a width $W_{SF}$, and a height $H_{SF}$. The stabilization frame 200 has a sufficient height $H_{SF}$ such that the vertical rails 204 (i.e., the sides 200s) of the stabilization frame 200 extend above an edge 12e of a mounting structure 12, i.e., above the top edge 12e of a parapet wall 12 when the stabilization frame 200 sits on a rooftop 16 (see, e.g., FIG. 6). In some embodiments, the stabilization frame 200 may have a length $L_{SF}$ in the range of about 30 inches to about 40 inches, a width $W_{SF}$ in the range of about 45 inches to about 55 inches, and a height $H_{SF}$ in the range of about 40 inches to about 50 inches. For example, in some embodiments, the stabilization frame 200 has a length $L_{SF}$ of 36 inches, a width $W_{SF}$ of 50 inches, and a height $H_{SF}$ of 42 inches. As discussed in further detail below, in some embodiments, the weight of the stabilization frame 200 is sufficient to ballast the mount 100 on a mounting structure 12 when telecommunications equipment 14 is secured to the mount 100 (i.e., the weight of the stabilization frame 200 is equal to or greater than the total weight of the telecommunications equipment 14 (and a mounting pipe 550) secured to the mount 100).

In some embodiments, the bottom 200b of the stabilization frame 200 may comprise one or more cross-beam rails 208. The cross-beam rails 208 may provide additional structural support to the stabilization frame 200, for example, when the stabilization frame 200 has an open bottom 200b. As shown in FIG. 2C, in some embodiments, the stabilization frame 200 comprises two cross-beam rails 208 that are coupled to the lower rails 202 and intersect in the center of the bottom 200b of the stabilization frame 200 dividing the bottom 200b into four sections A-D. In some embodiments, more than two cross-beam rails 208 may be used to divide the bottom 200b into more than four sections. For example, in some embodiments, the stabilization frame 200 may comprise three cross-beam rails 208 that divide the bottom 200b of the stabilization frame 200 into six sections.

In addition, in some embodiments, the cross-beam rails 208 (together with the lower rails 202) may be configured to hold weighted items 150 to help further ballast the mount 100 on a mounting structure 12. For example, in some embodiments, each of the lower rails 202 may have a flange 202a that extends inward and parallel relative to the bottom 200b of the stabilization frame 200. In some embodiments, each cross-beam rail 208 has two flanges 208a, each flange 208a extending outwardly in an opposite direction and parallel relative to the bottom 200b of the stabilization frame 200. Thus, as shown in FIG. 2C, the flanges 202a, 208a together form a ledge around the periphery of each of the section A-D. The flanges 202a, 208a are configured such that a weighted item 150 is prevented from passing through the bottom 200b of the stabilization frame 200 when the item 150 is placed within the cavity 210 (see, e.g., FIG. 5). The flanges 202a, 208a are also configured support and hold the weighted item 150 within the respective section A-D.

Figure 5:
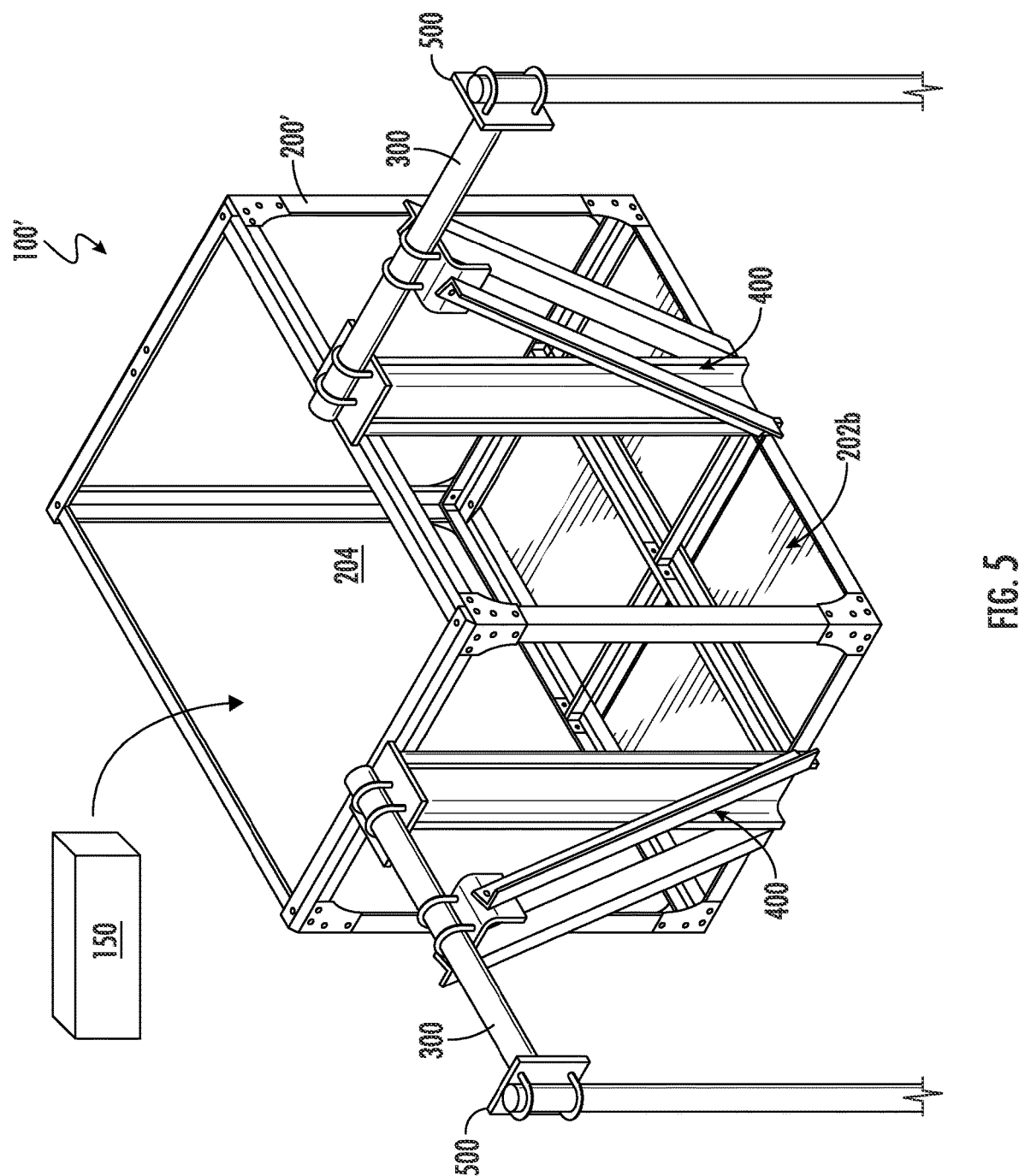
FIG. 5 is a perspective view of a telecommunications equipment mount configured to hold weighted items (i.e., ballast) according to embodiments of the present invention.

In some embodiments, the bottom 200b and sides 200s of the stabilization frame 200 may comprise one or more panels 212 to enclose the cavity 210. For example, as shown in FIG. 5, in some embodiments, the bottom 200b comprises a panel 212 within each section A-D to create a closed bottom 200b'. A closed bottom 200b' may provide additional support when holding heavier weighted items 150 within the cavity 210. Adding weighted items 150 to the interior cavity 210 of the stabilization frame 200 may help to further ballast the mount 100 on a mounting structure 12 (see, e.g., FIG. 6), for example, when heavier telecommunications equipment 14 is being secured to the mount 100. The ability to add weighted items 150 to the mount 100 may also help to mitigate or eliminate the need to further secure the mount 100 to a mounting structure 12 (e.g., bolting the mount 100 to the mounting structure 12 or rooftop 16).

Referring back to FIGS. 2A-2C, each mounting member 300 extends outwardly from, and perpendicular to, one of the sides 200s of the stabilization frame 200. In some embodiments, the mount 100 may comprise two mounting members 300 (also referred to as a "double sector" mount 100), each mounting member 300 extending outwardly from a different side 200s of the stabilization frame 200 (see, e.g., FIG. 2A-6). The mounting member 300 extends outwardly from the stabilization frame 200 a sufficient distance $D_{MM}$ (i.e., equal to the length of the mounting member 300) such that an end 300e of the mounting member 300 extends over an edge 12e of a mounting structure 12, for example, a parapet wall (see, e.g., FIG. 6). For example, in some embodiments, the mounting member 300 may extend outwardly from the side 200s of the stabilization frame 200 a distance $D_{MM}$ in the range of about 20 inches to about 40 inches. Double sector telecommunications equipment mounts 100 of the present invention (i.e., mounts 100 having two mounting members 300) may be used, for example, at a corner 12c of the mounting structure 12 (e.g., the corner 12c of a parapet wall 12 on a rooftop 16) (see, e.g., FIG. 6).

In some embodiments, each of the brace members 400 may comprise a first bracket 402 and a second bracket 404. The first bracket 402 is coupled to or integral with a side 200s of the stabilization frame 200. In some embodiments, an upper end $402e_2$ of the first bracket 402 includes a first connector 406. The first connector 406 (shown here as a U-bolt) is configured to secure the mounting member 300 to stabilization frame 200 of the mount 100. A first end $404e_1$ of the second bracket 404 is attached to a lower end $402e_1$ of the first bracket 402. The second bracket 404 of the brace member 400 extends outwardly from the stabilization frame 200 at an angle α. In some embodiments, the second bracket 404 may extend outwardly from the side 200s of the stabilization frame 200 at an angle α in the range of about 20 degrees to about 50 degrees. For example, in some embodiments, the angle α may be fixed at 22 degrees.

An opposing second end $404e_2$ of the second bracket 404 includes a second connector 408. Like the first connector 406, the second connector 408 (shown here as a U-bolt) is configured to further secure the mounting member 300 to the stabilization frame 200 of the mount 100. The second connector 408 is secured to the mounting member 300 at a different location than where the first connector 406 is secured to the mounting member 300. As shown in FIG. 2B and FIG. 2C, in some embodiments, the second connector 408 may be secured at approximately the middle of the mounting member 300. For example, in some embodiments, the second connector 408 (i.e., the second bracket 404) may be secured to the mounting member 300 at about 10 inches to about 20 inches from the end 300e of the mounting member 300.

Together, the first and second brackets 402, 404 of the brace member 400 provide structural support to the mounting member 300 (and the telecommunications equipment 14, e.g., the remote radio units 20 and/or antennas 22 that may be mounted thereon). In some embodiments, each mounting location (i.e., each mounting member 300 and brace member 400) is configured to support telecommunications equipment 14 having a combined total weight up to about 150 pounds. For example, in some embodiments, each mounting location of the mount 100 may support telecommunications equipment 14 having a total weight of 100 pounds for a maximum elevation of 150 feet.

Still referring to FIGS. 2A-2C, in some embodiments, the mount 100 of the present invention may further comprise a mounting pipe 550. In some embodiments, telecommunications equipment 14 may be mounted to the mounting pipe 550 (see, e.g., FIGS. 4A-4B and FIG. 6). In other embodiments, telecommunications equipment 14 may be mounted directly to the mounting member 300. In some embodiments, the mounting member 300 may include a third connector 500. The third connector 500 (shown here as a U-bolt) may be configured to secure the mounting pipe 550 to the mounting member 300 (see, e.g., FIGS. 2A-2C and FIGS. 4A-4B). In some embodiments, the mount 100 is configured to support a mounting pipe 550 having a length $L_{MP}$ in the range of about 48 inches to about 72 inches and having a diameter $D_{MP}$ in the range of about 2 inches to about 3 inches.

In addition, while the first, second, and third connectors 406, 408, 500 are shown as U-bolts, in some embodiments, other similar mounting connectors may be used with the telecommunications equipment mount 100.

Figure 3:
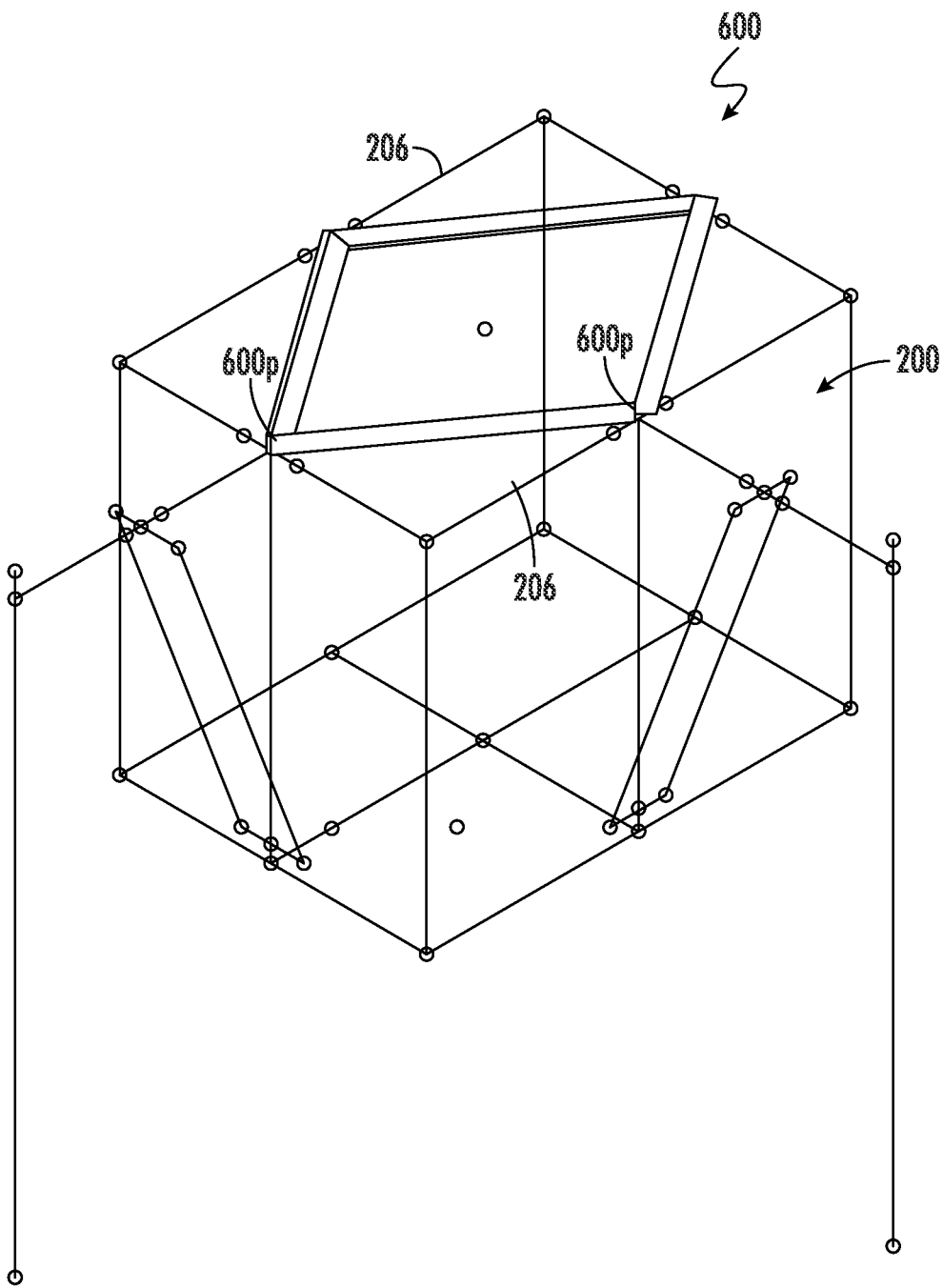
FIG. 3 is a perspective view of a high capacity support member according to embodiments of the present invention.

Referring to FIG. 3, in some embodiments, the telecommunications equipment mount 100 may further comprise a high-capacity support member 600. In some embodiments, the high-capacity support member 600 is a unitary member. In other embodiments, the high-capacity support member 600 may comprise one or more individual rails 602 (see, e.g., FIG. 4C). Like the cross-beam rails 208, the high-capacity support member 600 may be used to provide additional support to the stabilization frame 200 of the mount 100. For example, the high-capacity support member 600 may be used when heavier telecommunications equipment 14 (or when multiple pieces of telecommunications equipment 14, i.e., remote radio units 20 and antennas 22, see, e.g., FIG. 4C) is be mounted to the mount 100. As shown in FIG. 3, in some embodiments, the high-capacity support member 600 may be diamond-shaped with each of the points 600p of the high-capacity support member 600 being coupled to (or secured to) a respective side 200s of the stabilization frame 200. For example, in some embodiments, each point 600p of the high-capacity support member 600 may be attached to a top, center edge of each side 200s of the stabilization frame 200. As shown in FIG. 4C, when the high-capacity support member 600 comprises individual rails 602, the ends of each rail 602 may be secured in the center of a respective upper rail 206 of the stabilization frame 200.

Figure 4A:
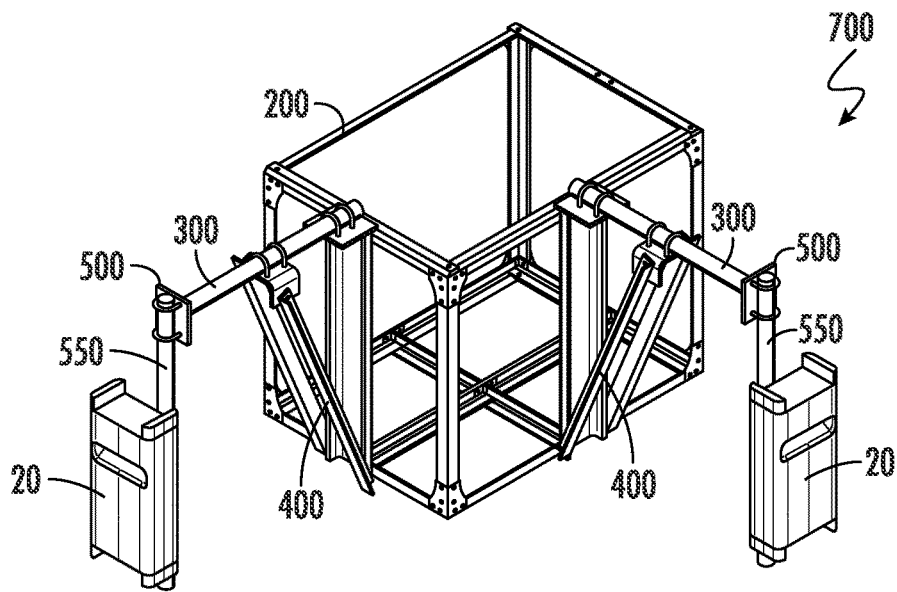
FIG. 4A is a perspective view of a telecommunications equipment mount with remote radio units mounted thereon according to embodiments of the present invention.
Figure 4B:
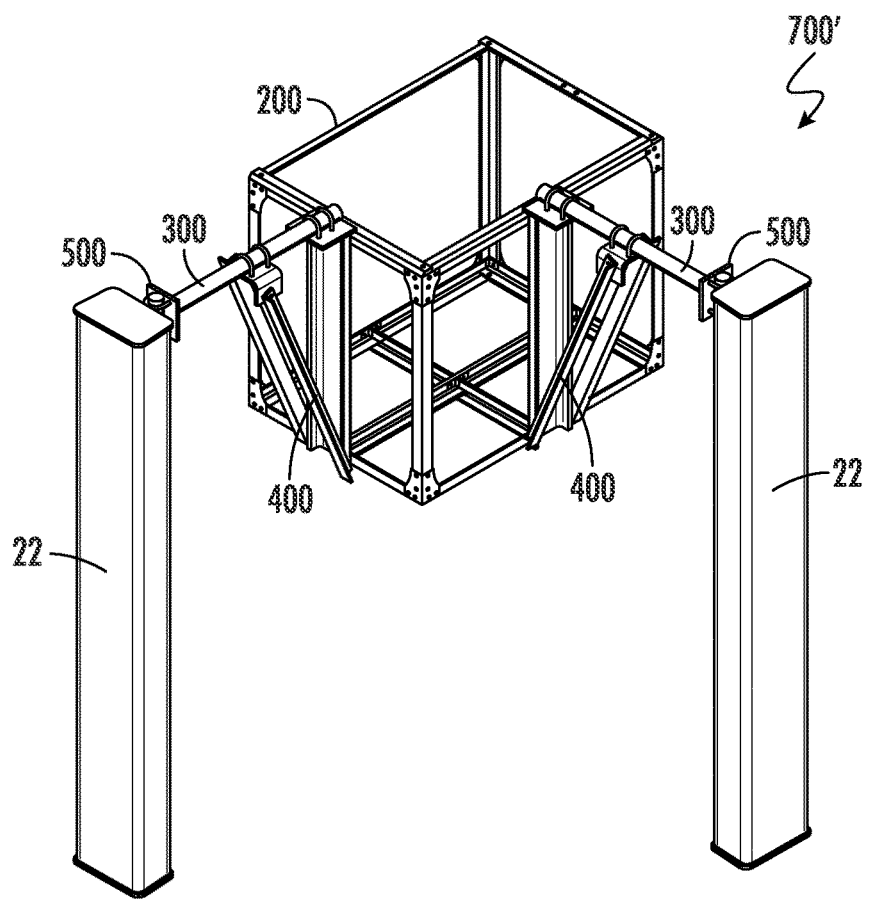
FIG. 4B is a perspective view of a telecommunications equipment mount with antennas mounted thereon according to embodiments of the present invention.

Telecommunications equipment mount assemblies are also provided herein. FIGS. 4A-4C illustrate telecommunications equipment mount assemblies 700, 700', 700" utilizing a telecommunications equipment mount 100 of the present invention in combination with different types of telecommunications equipment 14 mounted thereon. The telecommunications equipment mounts 100 of the present invention meet the structural standards for antenna supporting structures and antennas and are compliant with ANSI/TIA 222-G and ANSI/TIA 222-H. For example, the assemblies 700, 700', 700" of the present invention may be suitable for use with Structure Category I or II, Exposure B or C, and Topographical Category 1 according to ANSI/TIA 222-G and ANSI/TIA 222-H.

FIG. 4A illustrates a telecommunications equipment mount assembly 700 where remote radio units 20 are mounted on a telecommunications equipment mount 100 of the present invention. FIG. 4B illustrates a telecommunications equipment mount assembly 700' where antennas 22 are mounted on a telecommunications equipment mount 100 of the present invention. FIG. 4C illustrates a telecommunications equipment mount assembly 700" where both remote radio units 20 and antennas 22 are mounted on a telecommunications equipment mount 100 of the present invention. In each of these assemblies 700, 700', 700", the telecommunications equipment mount 100 counter-balances the weight of the telecommunications equipment 14 (i.e., remote radio units 20 and/or antennas 22) which will allow the assembly 700, 700', 700" to ballast on a mounting structure 12 without the need to further securing the mount 100 to the mounting structure 12, for example, with bolts (see, e.g., FIG. 6).

FIG. 5 illustrates a telecommunications equipment mount 100' having a stabilization frame 200' with a closed bottom 200b'. As discussed above, the closed bottom 200b' allows weighted items 150 to be placed within the interior cavity 210' of the stabilization frame 200. Placing one or more weighted items 150 within the stabilization frame 200 may allow the mount 100 to ballast on a mounting structure 12 when heavier (or multiple pieces of) telecommunications equipment 14 is being used with the mount 100.

Figure 6:
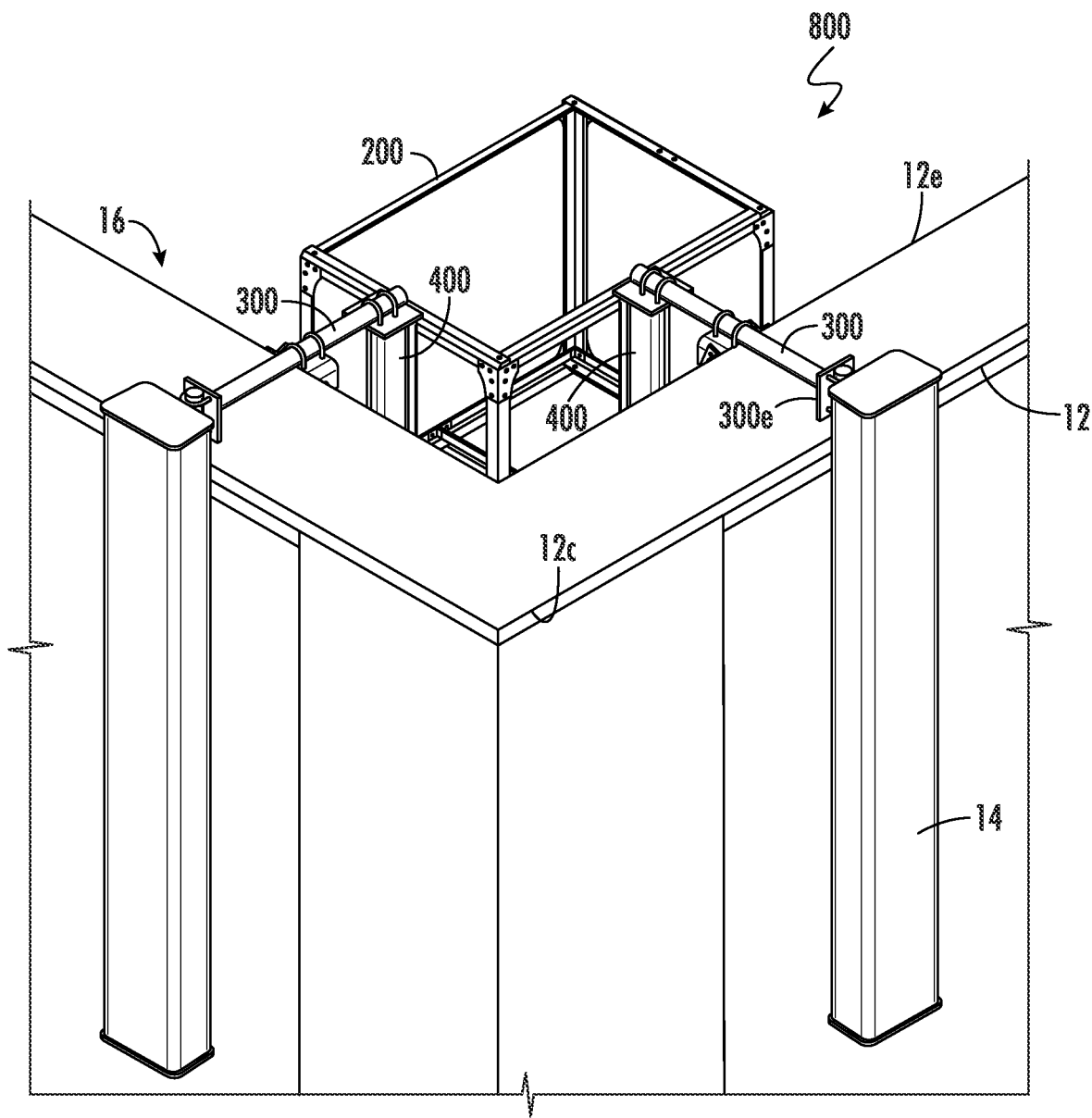
FIG. 6 is a perspective view of a telecommunications equipment mount assembly according to embodiments of the present invention.

A telecommunications equipment mount assembly 800 according to embodiments of the present invention is illustrated in FIG. 6. As shown in FIG. 6, a telecommunication equipment mount assembly 800 may comprise one or more items of telecommunications equipment 14 (e.g., antennas 22). The assembly 800 comprises a mounting structure 12, which may include a parapet wall. The assembly 800 further comprises a telecommunications equipment mount 100 according to embodiments of the present invention. As described above, the one or more units of telecommunications equipment 14 may be secured to the mount 100, and the mount 100 and equipment 14 are ballasted (or stabilized) on the parapet wall 12 (and rooftop 16) without the need to further secure the mount 100 to the rooftop 16 and/or parapet wall 12 with, for example, bolts. Thus, reducing the risk of damage, while also reducing costs and allowing for easy installation.

Figure 7:
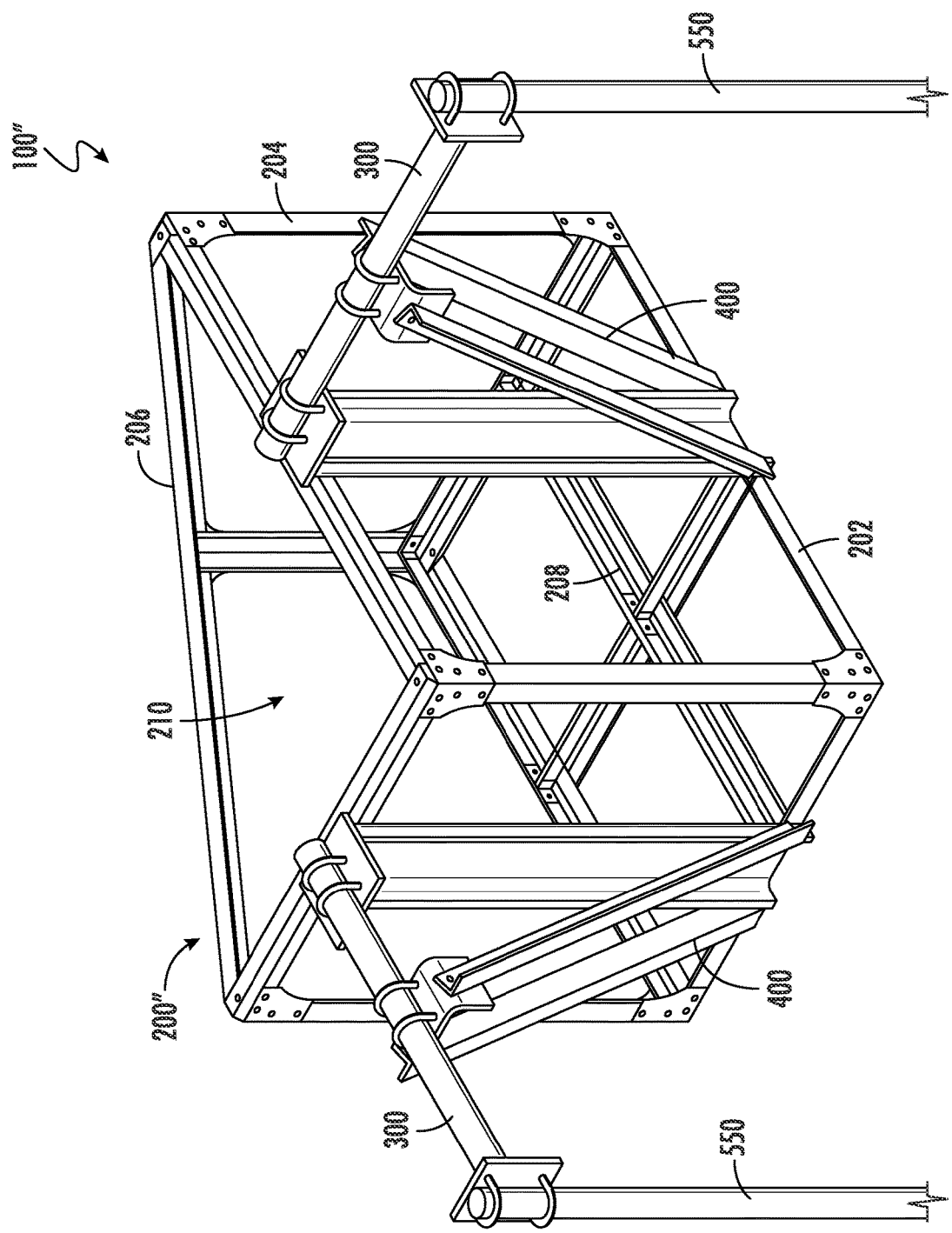
FIG. 7 is a perspective view of an alternative telecommunications equipment mount according to embodiments of the present invention.

FIG. 7 is a perspective view of an alternative telecommunications equipment mount 100" according to embodiments of the present invention. The telecommunications equipment mount 100" shown in FIG. 7 is similar to mounts 100, 100' described above, except that the stabilization frame 200" of the mount 100" comprises three upper rails 206.

Figure 8:
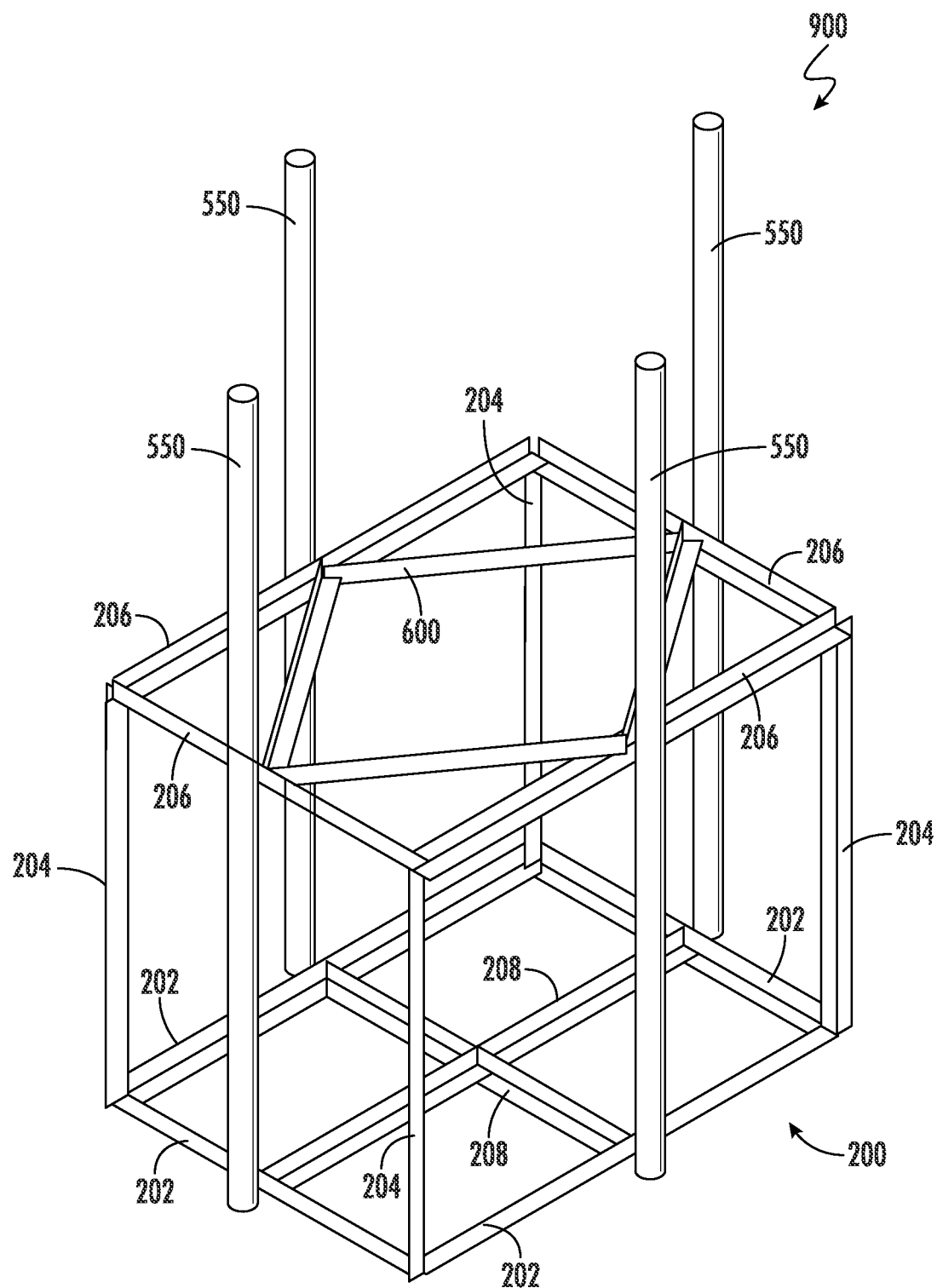
FIG. 8 is a perspective view of an alternative telecommunications equipment mount according to embodiments of the present invention.

Referring now to FIG. 8, an alternative telecommunications equipment mount 900 according to embodiments of the present invention is illustrated. The mount 900 is similar to the mount 100 described herein, except the mount 900 does not include at least one mounting member 300 or at least one brace member 400. Instead, one or more mounting pipes 550 are each coupled directly to or integrally with a respective side 200s of the stabilization frame 200. For example, in some embodiments, the mount 900 may comprise four (4) mounting pipes 550 (i.e., one mounting pipe 550 per side 200s of the stabilization frame 200).

As shown in FIG. 8, the mounting pipes 550 take the place of the first bracket 402 of the brace member 400 (i.e., mount 100). Each mounting pipe 550 extends above the upper rails 206 of the stabilization frame 200 (typically a distance of between about 48 inches and about 126 inches). The mounting pipes 550 are configured such that telecommunications equipment 14 (e.g., remote radio units 20 and/or antennas 22) may be mounted thereon. In some embodiments, the telecommunications equipment mount 900 may further comprise a high-capacity support member 600 as described herein (see also, e.g., FIG. 3).

The telecommunications equipment mount 900 is a non-penetrating, self-standing mount that can be installed anywhere on the rooftop 16. The mount 900 provides the flexibility of mounting antennas 22 and/or remote radio units 20 with a minimal footprint on the rooftop 16. The ability to incorporate the high-capacity support member 600 also allows the mount 900 to be installed in extreme wind regions (e.g., Florida). The telecommunications equipment mount 900 of the present invention meets the structural standards for antenna supporting structures and antennas and is compliant with ANSI/TIA 222-H. For example, the mount 900 of the present invention may be suitable for use with Structure Category II, Exposure B or C, and Topographical Category 1 according to ANSI/TIA 222-H. In some embodiments, weighted items 150 (e.g., sandbags) may be placed on the cross-beam rails 208 of the stabilization frame 200 to ballast the mount 900, for example, when heavier (or multiple pieces of) telecommunications equipment 14 (e.g., antennas 22 and/or remote radio units 20) is being used with the mount 900.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this That which is claimed is:

1. A telecommunications equipment mount, comprising:
   a stabilization frame having a bottom and at least three sides, the bottom and sides defining an open interior cavity;
   at least one mounting member perpendicular to one of the sides of the stabilization frame and extending outwardly from the side of the stabilization frame a distance; and
   at least one brace member, the at least one brace member comprising:
      a first bracket coupled to one side of the stabilization frame and configured to be secured to the at least one mounting member; and
      a second bracket extending outwardly from the same side of the stabilization frame at an angle, wherein a first end of the second bracket is coupled to a lower end of the first bracket and a second opposing end of the second bracket is configured to be secured to the at least one mounting member at a different location than the first bracket;
   wherein the stabilization frame is configured to ballast the mount on a mounting structure when telecommunications equipment is secured to the mount.

2. The mount of claim 1, wherein the mounting structure is a parapet wall.

3. The mount of claim 1, wherein the upper end of the first bracket includes a first connector and the second opposing end of the second bracket includes a second connector, the first and second connectors being configured to be secured to the at least one mounting member.

4. The mount of claim 1, wherein the mount comprises two mounting members and two brace members, each mounting member extending outwardly from a different side of the stabilization frame and supported by a respective brace member.

5. The mount of claim 1, wherein the telecommunications equipment is an antenna, a remote radio unit, or a combination thereof.

6. The mount of claim 1, further comprising a mount pipe secured to the at least one mounting member.

7. The mount of claim 6, wherein an antenna is secured to the mount pipe.

8. The mount of claim 6, wherein a remote radio unit is secured to the mount pipe.

9. The mount of claim 1, wherein the at least one mounting member extends outwardly from a side of the stabilization frame a distance in the range of about 20 inches to about 40 inches.

10. The mount of claim 1, wherein the second bracket of the at least one brace member is secured to the at least one mounting member at approximately half the distance the mounting member extends outwardly from the side of the stabilization frame.

11. The mount of claim 1, wherein the stabilization frame comprises a closed bottom and the open interior cavity of the stabilization frame is configured to hold one or more weighted items.

12. The mount of claim 1, wherein the bottom of the stabilization frame comprises one or more cross-beam rails.

13. The mount of claim 1, wherein the at least one mounting member comprises a third connector.

14. A telecommunications equipment mount assembly, comprising:
   one or more units of telecommunications equipment;
   a mounting structure, wherein the mounting structure comprises a parapet wall;
   a telecommunications equipment mount, the mount comprising:
      a stabilization frame having a bottom and at least three sides, the bottom and sides defining an open interior cavity;
      at least one mounting member extending outwardly from, and perpendicular to, one of the sides of the stabilization frame a distance;
      at least one brace member, the at least one brace member comprising a first bracket coupled to one side of the stabilization frame and configured to be secured to the at least one mounting member and a second bracket extending outwardly from the same side of the stabilization frame at an angle, wherein a first end of the second bracket is coupled to a lower end of the first bracket and a second opposing end of the second bracket is configured to be secured to the at least one mounting member at a different location than the first bracket; and
      at least one mounting pipe secured to the at least one mounting member,
   wherein the one or more units of telecommunications equipment is secured to the at least one mounting pipe, and the telecommunications equipment mount and telecommunications equipment are ballasted on the parapet wall.

15. The assembly of claim 14, wherein the telecommunications equipment is an antenna, a remote radio unit, or a combination thereof.

16. A telecommunications equipment mount, comprising:
   a stabilization frame having a bottom and at least three sides, the bottom and sides defining an open interior cavity;
   a high-capacity support member coupled to the sides of the stabilization frame;
   at least one mounting member perpendicular to one of the sides of the stabilization frame and extending outwardly from the side of the stabilization frame a distance;
   at least one brace member, the at least one brace member comprising:
      a first bracket coupled to one side of the stabilization frame and configured to be secured to the at least one mounting member; and
      a second bracket extending outwardly from the same side of the stabilization frame at an angle, wherein a first end of the second bracket is coupled to a lower end of the first bracket and a second opposing end of the second bracket is configured to be secured to the at least one mounting member at a different location than the first bracket,
   wherein the stabilization frame is configured to ballast the mount on a mounting structure when telecommunications equipment is secured to the mount, and
   wherein the high-capacity support member is configured to provide additional support to the stabilization frame when heavier telecommunications equipment is secured to the mount.

17. The mount of claim 16, wherein the mounting structure is a parapet wall.

18. The mount of claim 16, wherein the upper end of the first bracket includes a first connector and the second opposing end of the second bracket includes a second connector, the first and second connectors being configured to be secured to the at least one mounting member.

19. The mount of claim 16, wherein the mount comprises two mounting members and two brace members, each mounting member extending outwardly from a different side of the stabilization frame and supported by a respective brace member.

20. The mount of claim 16, wherein the stabilization frame comprises a closed bottom and the open interior cavity of the stabilization frame is configured to hold one or more weighted items.

\* \* \* \* \*